(12) United States Patent
Wang et al.

(10) Patent No.: US 10,062,769 B2
(45) Date of Patent: Aug. 28, 2018

(54) METHODS OF FABRICATING SEMICONDUCTOR DEVICES

(71) Applicant: TAIWAN SEMICONDUCTOR MANUFACTURING CO., LTD., Hsinchu (TW)

(72) Inventors: Po-Shu Wang, Hsinchu County (TW); Chien-Mao Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 26 days.

(21) Appl. No.: 15/486,173

(22) Filed: Apr. 12, 2017

(65) Prior Publication Data

US 2017/0222019 A1    Aug. 3, 2017

Related U.S. Application Data

(62) Division of application No. 14/859,153, filed on Sep. 18, 2015, now Pat. No. 9,627,474.

(51) Int. Cl.
| | |
|---|---|
| *H01L 21/00* | (2006.01) |
| *H01L 29/66* | (2006.01) |
| *H01L 21/3213* | (2006.01) |
| *H01L 29/06* | (2006.01) |
| *H01L 29/51* | (2006.01) |
| *H01L 29/78* | (2006.01) |
| *H01L 21/311* | (2006.01) |

(Continued)

(52) U.S. Cl.
CPC .. *H01L 29/66545* (2013.01); *H01L 21/31053* (2013.01); *H01L 21/31144* (2013.01); *H01L 21/32134* (2013.01); *H01L 29/0649* (2013.01); *H01L 29/517* (2013.01); *H01L 29/6656* (2013.01); *H01L 29/66795* (2013.01); *H01L 29/785* (2013.01); *H01L 29/7833* (2013.01); *H01L 21/0214* (2013.01); *H01L 21/0217* (2013.01)

(58) Field of Classification Search
CPC ........... H01L 29/6645; H01L 21/32134; H01L 29/649; H01L 29/517; H01L 29/7833; H01L 29/785; H01L 21/31144; H01L 29/6656; H01L 21/31053; H01L 29/66795; H01L 21/0217
USPC .......... 438/154, 153, 216, 391, 42; 257/401, 257/409, 410, E21.622
See application file for complete search history.

(56) References Cited

U.S. PATENT DOCUMENTS

| | | |
|---|---|---|
| 5,982,671 A | 11/1999 | Kang et al. |
| 9,064,723 B2 | 6/2015 | Won et al. |

(Continued)

*Primary Examiner* — Thinh T Nguyen
(74) *Attorney, Agent, or Firm* — Maschoff Brennan (57) ABSTRACT

A semiconductor device and a method for fabricating the same are disclosed. The semiconductor device comprises: a semiconductor substrate with an active area defined by a plurality of isolation features; a gate stack extending across the active area onto portions of the isolation features, wherein the gate stack comprising a gate dielectric layer on the active area and the portions of the isolation features, and a gate electrode on the gate dielectric layer; and a protective seal comprising a vertical portion lining sidewalls of the gate stack and a horizontal portion extending onto a top surface of the isolation features, wherein the horizontal portion surrounding portions of the gate stack outside the active area in a top view.

20 Claims, 6 Drawing Sheets

(51) Int. Cl.
*H01L 21/3105* (2006.01)
*H01L 21/02* (2006.01)

(56) References Cited

U.S. PATENT DOCUMENTS

| | | |
|---|---|---|
| 2008/0023774 A1 | 1/2008 | Sato et al. |
| 2010/0052074 A1* | 3/2010 | Lin ................ H01L 21/823807 |
| | | 257/407 |
| 2011/0101441 A1 | 5/2011 | Bicksler |
| 2013/0299916 A1 | 11/2013 | Won et al. |
| 2014/0361364 A1 | 12/2014 | Chen et al. |
| 2016/0133525 A1 | 5/2016 | Lee et al. |

* cited by examiner

METHODS OF FABRICATING SEMICONDUCTOR DEVICES

CROSS REFERENCE TO RELATED APPLICATION

The present application is a Divisional application of the U.S. application Ser. No. 14/859,153, filed Sep. 18, 2015, which is herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a metal-oxide-semiconductor field-effect transistor (MOSFET) is scaled down through various technology nodes, several strategies have been employed to improve device performance, such as using high-k (HK) dielectric material and metal gate (MG) electrode structures, strain engineering, 3-D gate transistors and ultra-thin body (UTB). While existing methods of fabricating the MOSFET devices have been generally adequate for their intended purposes, they have not been entirely satisfactory in every aspect. An improved fabrication method with improved reliability and increased performance continues to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, the present disclosure is a semiconductor device and method of fabricating the same to provide a simple and cost-effective process flow to achieve an protective seal to avoid wet etchant to consume isolation features and then penetrate into a gate dielectric, such as a high-k (HK) dielectric, thereby preventing the gate dielectric from damage upon etching.

Figure 1:
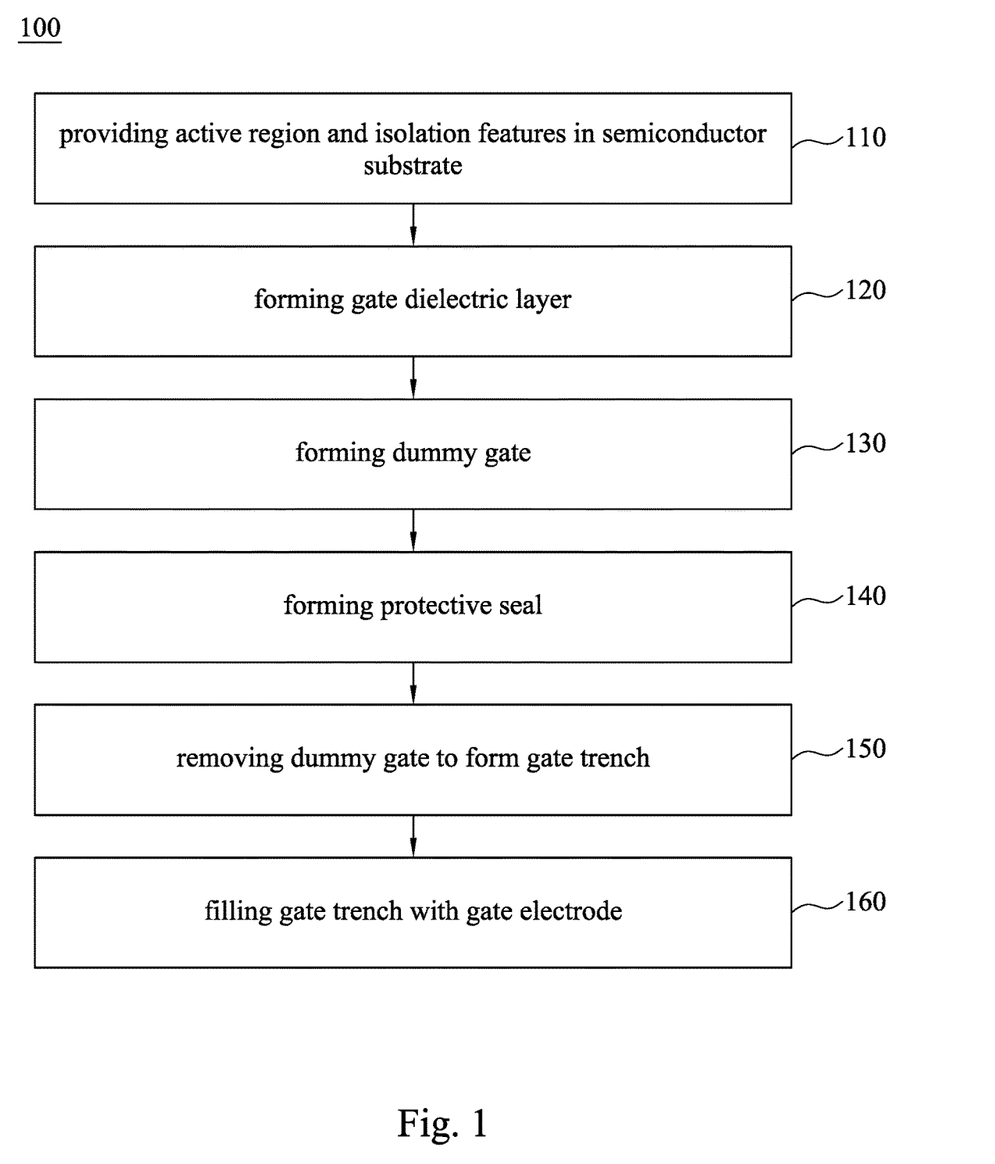
FIG. 1 is a flowchart of a method for fabricating a semiconductor device according to aspects of the present disclosure.
Figure 2:
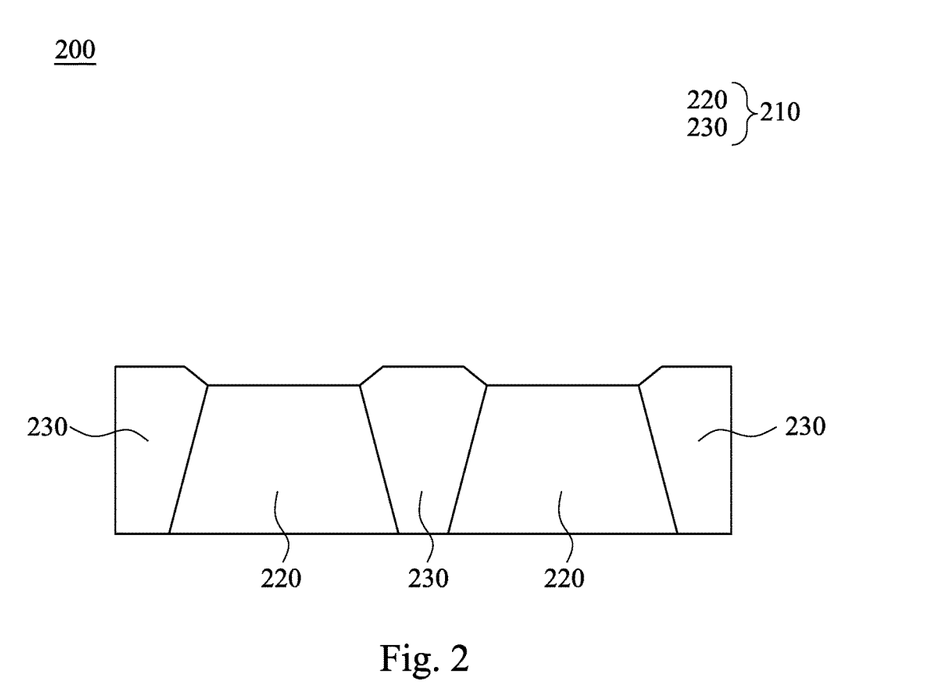
FIGS. 2-9 are cross-sectional views of intermediate stages in the manufacturing of semiconductor devices in accordance with some embodiments of the present disclosure.

FIG. 1 is a flowchart of one embodiment of a method 100 for fabricating a semiconductor device having a protective seal capable of preventing a gate dielectric from damage upon etching according to aspects of the present disclosure. FIGS. 2 and 8 are sectional views of one embodiment of a semiconductor device 200 at various fabrication stages. The semiconductor device 200 and the method 100 of making the same are collectively described with reference to FIGS. 1 through 9. It is understood that additional steps can be provided before, during, and after the method 100, and some of the steps described can be replaced or eliminated for other embodiments of the method.

Referring to FIG. 1, the method 100 for fabricating a semiconductor device 200 begins at step 110 by providing a semiconductor substrate 210 with an active area 220 defined by a plurality of isolation features 230, to obtain a structure as shown in FIG. 2. In some embodiments, the exemplary semiconductor substrate 210 may be a bulk silicon substrate. Alternatively, the exemplary semiconductor substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The exemplary semiconductor substrate 210 may further include various active areas 220, such as regions configured for an N-type metal-oxide-semiconductor transistor device and regions configured for a P-type metal-oxide-semiconductor transistor device. In addition, the exemplary semiconductor substrate 210 may be doped with a p-type or an n-type impurity. The doped regions are doped with p-type dopants, such as boron or BF2; n-type dopants, such as phosphorus or arsenic; or combinations thereof. The exemplary semiconductor substrate 210 may include various doped regions depending on design requirements as known in the art (e.g., p-type wells or n-type wells). The doped regions may be formed directly on the semiconductor substrate 210, in a P-well structure, in an N-well structure, in a dual-well structure, or using a raised structure. Further, the exemplary semiconductor substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the exemplary semiconductor substrate 210 may include a semiconductor-on-insulator (SOI) structure such as a buried dielectric layer. Also alternatively, the exemplary semiconductor substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and material.

In some embodiments, the exemplary semiconductor substrate 210 also includes various isolation features 230, such as shallow trench isolation (STI), formed in the semiconductor substrate 210 to define and separate various devices, such as active areas 220. The formation of the exemplary isolation features 230 may include etching a trench in a semiconductor substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the exemplary isolation features 230 may be created using a process sequence such as: growing a pad oxide, forming a low pressure chemical vapor deposition (LPCVD) nitride layer, patterning an isolation features 230 opening using photoresist and masking, etching a trench in the semiconductor substrate, optionally growing a thermal oxide trench liner to improve the trench interface, filling the trench with CVD oxide, and using chemical mechanical planarization (CMP) to remove the excessive dielectric metals layers.

Figure 3:
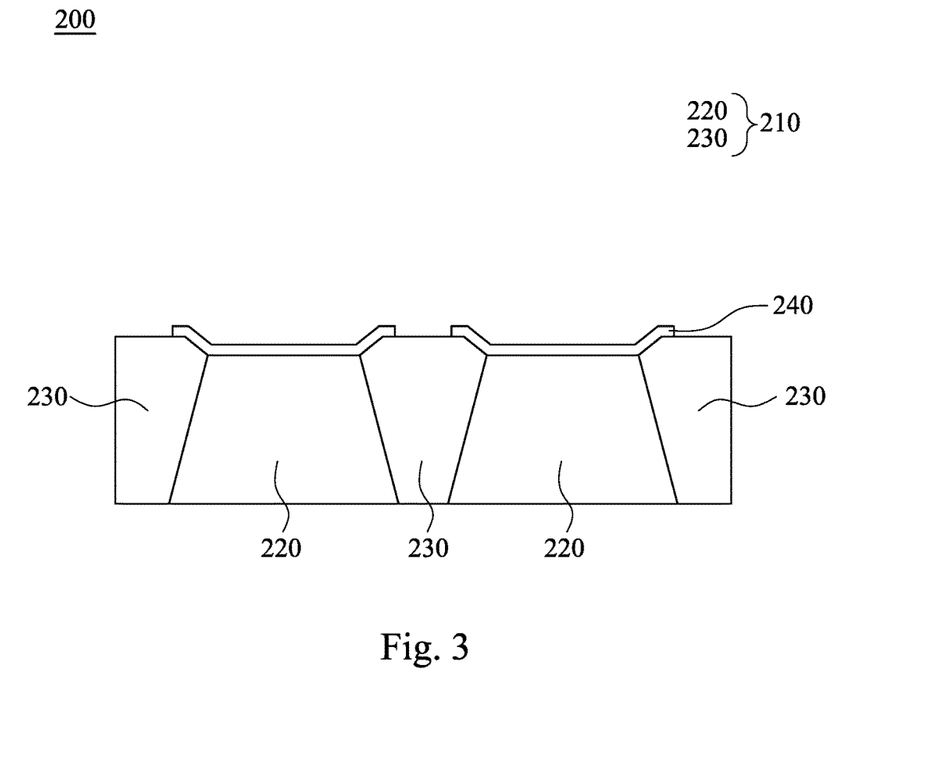
Figure 4:
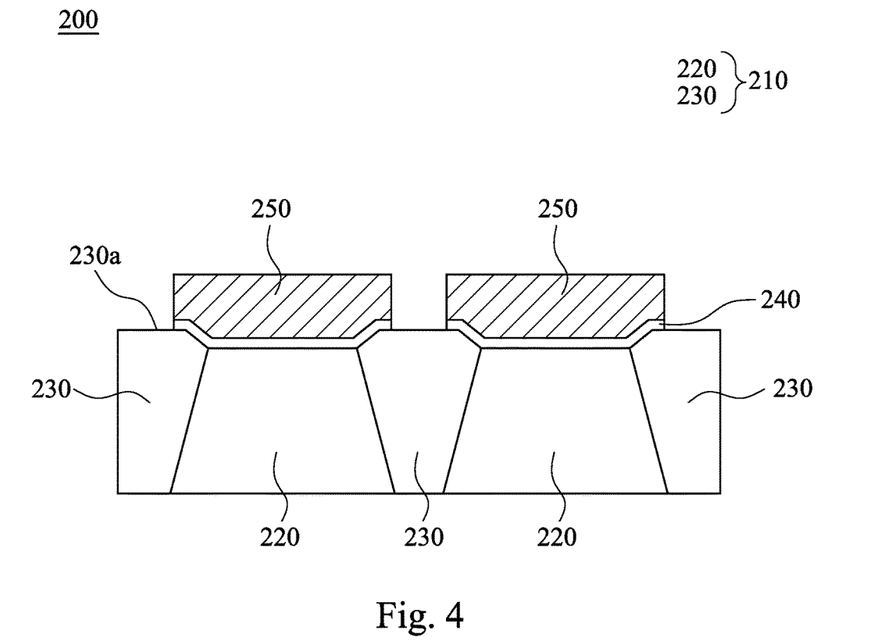

The method 100 proceeds to steps 120 and 130 by forming a plurality of gate stacks on the semiconductor substrate 210, to obtain the structure as shown in FIGS. 3 and 4. In some embodiments, the gate stack 240, 250 extends across the active area 220 onto portions of the isolation features 230. In some embodiments, the gate stack comprises a gate dielectric layer 240 on the active area 220 and the portions of the isolation features 230, and a dummy gate 250 on the gate dielectric layer 240. In some embodiments, the exemplary gate dielectric layer 240 includes a high-k (HK) dielectric material selected from the group consisting of: hafnium oxide, HfSiO, HfSiON, HfTaO, HfTiO, HfZrO, zirconium oxide, aluminum oxide, hafnium dioxide-alumina ($HfO_2$—$Al_2O_3$) alloy, and combinations thereof. In some embodiment, the exemplary gate dielectric layer 240 is formed by a suitable process such as ALD. Other methods to form the high k dielectric material layer include metal organic chemical vapor deposition (MOCVD), physical vapor deposition (PVD), UV-ozone oxidation or molecular beam epitaxy (MBE). In some embodiments, an interfacial layer (not shown) may be formed on the semiconductor substrate 210. The interfacial layer may include silicon oxide formed by a proper technique, such as an atomic layer deposition (ALD), thermal oxidation or UV-ozone oxidation. In some embodiments, the exemplary gate dielectric layer 240 is formed on the active area 220 and portions of the isolation features 230, and then a dummy gate 250 is formed on the gate dielectric layer. In some embodiments, in step 130, the exemplary semiconductor device 200 may be fabricated in a high-k dielectric/metal gate last process. In some embodiments, in a high-k dielectric/metal gate last process, a dummy gate 250 are initially formed as shown in FIG. 4, and may then be removed and replaced with a metal gate electrode, which will be described in detail later.

In some embodiments, in steps 120 and 130, a plurality of gate stacks 240, 250 is formed on the semiconductor substrate. The plurality of gate stacks may include a dielectric layer, and a dummy gate. In some embodiments, a capping layer (not shown) may be formed on the gate dielectric layer 240. The capping layer may include refractory metals and their nitrides (e.g. TiN, TaN, $W_2N$, TiSiN, TaSiN) formed by a suitable process know in the art. The dummy gate 250 (e.g. a polysilicon layer) may be formed on the capping layer. The dummy gate 250 (e.g. a polysilicon layer) is formed by a proper technique, such as CVD in a conventional manner. In some embodiments, the exemplary dummy gate 250 is selected from the group consisting of polycrystalline silicon, amorphous silicon, microcrystal silicon and combinations thereof. The exemplary gate stacks may be formed in different regions of the substrate, for example, regions defined for NFET devices, regions defined for PFET devices, regions defined for high-resistance transistors, regions defined for non-functional transistors (also known as dummy transistors), and/or other suitable regions defined by a design for an integrated circuit.

In some embodiments, a patterned hard mask (not shown) may be formed on the dummy gate 250 (e.g. a polysilicon layer) to define various gate stack regions and various openings exposing the gate stack material layers to be removed. The patterned hard mask includes titanium nitride, silicon nitride and/or silicon oxide, or alternatively photoresist. The patterned hard mask may include a bi-layer. In some embodiments, the hard mask may include a bi-layer of titanium nitride, silicon oxide and silicon nitride deposited by CVD process. The titanium nitride, silicon nitride and silicon oxide layers are further patterned using a photolithography process to form a patterned photoresist layer and an etching process to etch the titanium nitride, silicon oxide and silicon nitride within the openings of the patterned photoresist layer.

In some embodiments, by using the patterned hard mask as an etch mask, an etching process may be applied to form gate stacks by etching the dummy gate 250 (e.g. a polysilicon layer), the capping layer (not shown), the gate dielectric layer 240 and the interfacial layer (not shown). The etching process includes a dry etch, a wet etch, or a combination of dry etch and wet etch. The dry etching process may implement a, fluorine-containing gas (e.g $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. The etching process may include a multiple-step etching to gain etch selectivity, flexibility and desired etch profile. In some embodiments, a multiple-step dry etching is employed in a conventional manner.

Figure 5:
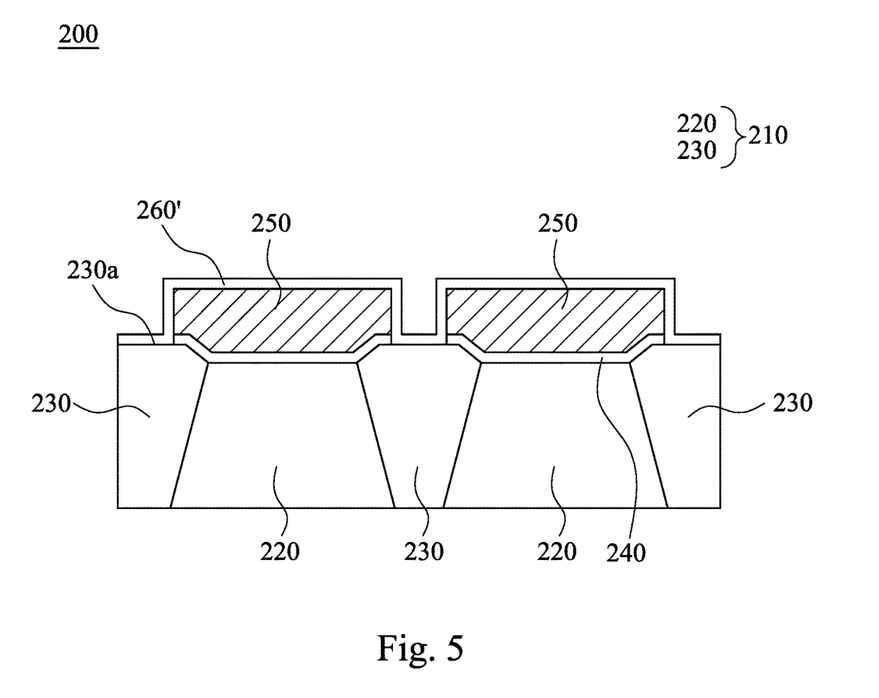
Figure 6:
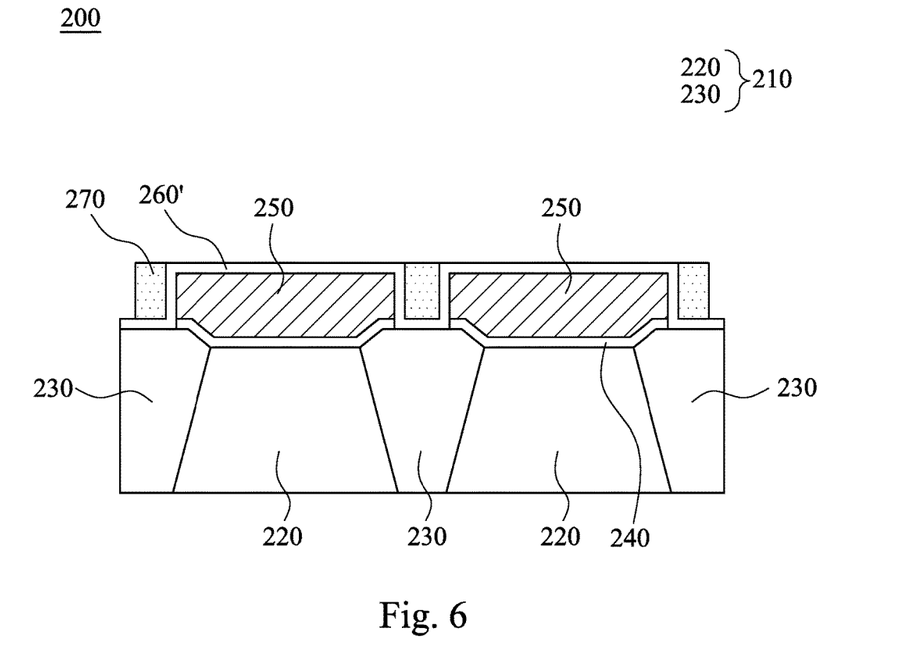

The method 100 proceeds to step 140 by forming a protective seal 260. In some embodiments, in step 140, a seal material 260' is deposited conformally covering the gate stack 240, 250 and the top surface of the isolation features 230 as shown in FIG. 5. Then, referring to FIG. 6, an etch mask 270 is formed covering the seal material 260' on the top surface of the isolation features 230 which surround portions of the gate stack 240, 250 outside the active area 220 in a top view, while exposing the seal material 260' on the top surface of the gate stack 240, 250. In some embodiments, the etch mask 270 may be a patterned photoresist layer formed by a photolithography process. An exemplary photolithography process includes spin coating a photoresist layer overlying the substrate, exposing the photoresist to a pattern, performing a post-exposure bake process, and developing the photoresist to form a patterned photoresist layer. In other embodiments, the etch mask 270 may be patterned hard mask including, but not limited to, silicon nitride, silicon oxide, silicon oxynitirde, or combinations thereof. The patterned hard mask may be deposited by a CVD process and then patterned by photolithography and etching processes.

Figure 7:
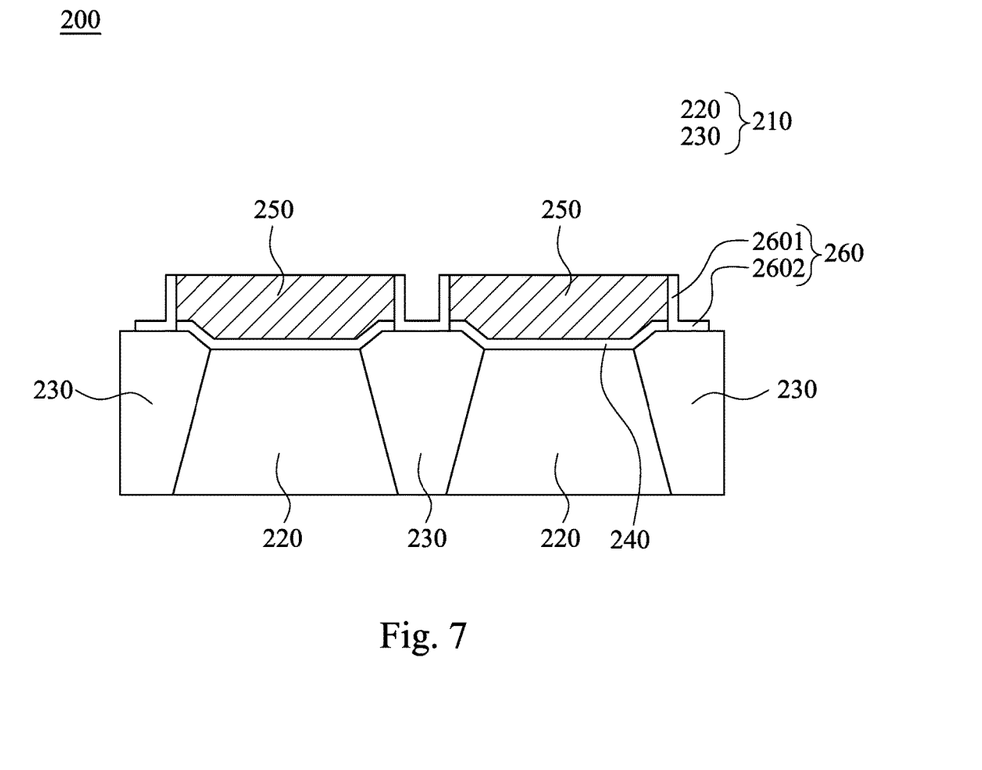
Figure 8:
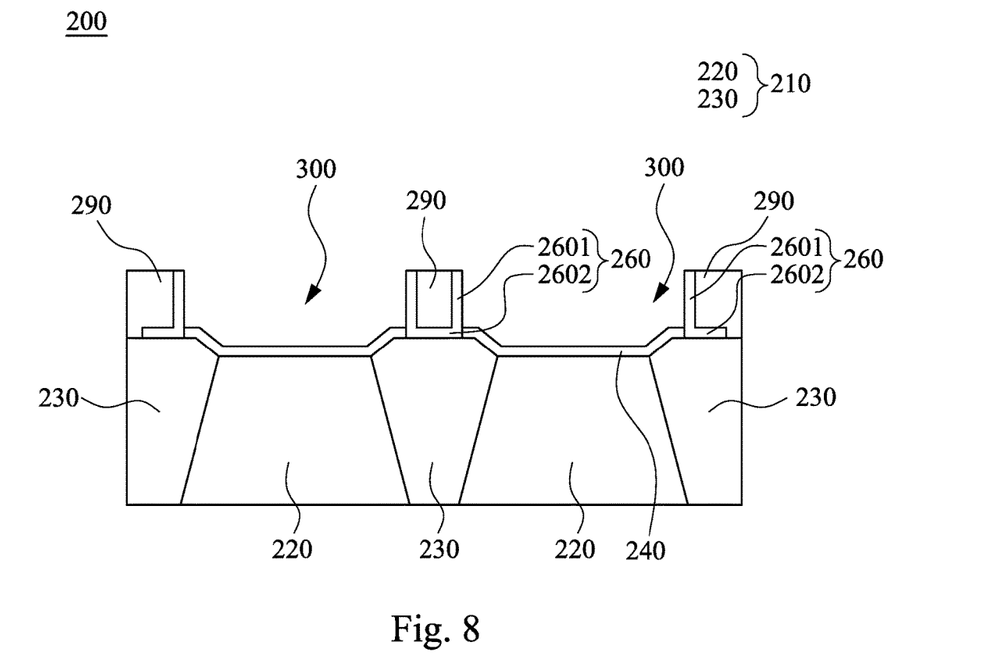

Referring to FIG. 7, after the formation of the etch mask 270, an etching process is then performed to remove the seal material 260' exposed by the etch mask 270 to obtain the protective seal 260, followed by removal of the etch mask 270. The etch mask 270 may be removed by ashing or selective wet etching. As shown in FIG. 7, in some embodiments, the exemplary protective seal 260 includes a vertical portion 2601 lining sidewalls of the gate stack 240, 250 and a horizontal portion 2602 extending onto a top surface of the isolation features 230. It should be noted that the horizontal portion 2602 surrounds portions of the gate stack outside the active area 220 in a top view, which will be illustrated in FIG. 10. In some embodiments, the exemplary protective seal comprises silicon nitride, silicon oxynitride, or combinations thereof. In some embodiments, the etching is a wet etching employing a solution comprising dilute HF (DHF) solution, buffered oxide etch (BOE) solution, hot phosphoric acid or $H_2O_2$. The protective seal 260 is capable of preventing the gate dielectric 240 and the isolation features 230 (such as STI) from damage during the subsequent processing. For example, it has been observed that in a wet etch process for forming the gate spacer, wet etchant may consume the isolation features, penetrate into the gate stack and damage the gate dielectric 240. However, the protective seal 260 can prevent wet etchant from penetrating into the gate dielectric 240 and the isolation features 230 during the subsequent processing, such as spacer formation, dummy gate removal, and so on. As such, the semiconductor device 200 can be fabricated with improved reliability and operation performance.

After formation of the gate stack, the semiconductor device 200 may undergo additional CMOS processing to form various features of the NFET and PFET devices as is known in the art. As such, the various features are only briefly discussed herein. The various features may include, lightly doped source/drain regions (n-type and p-type LDD), sidewall or gate spacers, source/drain (S/D) regions, silicide features, contact etch stop layer (CESL), and an interlayer dielectric (ILD). It should be noted that strained structures such as silicon germanium (SiGe) and silicon carbide (SiC) features may be formed in the PFET and NFET devices, respectively, to boost and enhance the performance of the devices.

In some embodiments, gate spacers (not show) may be formed abutting the sidewalls of the gate stack 240, 250 prior to or after the formation of the source/drain regions (or portions thereof). The gate spacers may include one or more dielectric materials, such as silicon oxide, silicon nitride, silicon oxynitride or combinations thereof. The spacer elements may be formed by depositing a dielectric material followed by an isotropic etching process, however other embodiments are possible. In some embodiments, the protective seal 260 is formed on sidewalls of the gate stacks and the main spacer is formed on the protective seal 260. In one embodiment, the spacers include additional layers. For example, a dielectric layer (not shown) is formed on the protective seal first then the main spacer is formed on the dielectric layer. Accordingly, the main spacer can be considered a bi-layer spacer, with spacers. In some embodiments, the protective seal includes silicon nitride, the dielectric layer includes silicon oxide and the main spacer includes silicon nitride. The spacers are formed by deposition, photolithography and etch processes in a conventional manner.

In some embodiments, source and drain regions (not shown) are formed by a proper technique, such as one or more ion implantations. The source/drain regions may include the introduction of suitable dopant types: n-type or p-type dopants. The source/drain regions m spacers spacers spacers spacers spacers spacers spacers spacers spacers spacers spacers spacers ay include halo or low-dose drain (LDD) implantation, source/drain implantation, source/drain activation and/or other suitable processes. In some embodiments, the source/drain regions may include raised source/drain regions, strained regions, epitaxially grown regions, and/or other suitable techniques. In an embodiment, the source/drain activation process may include a rapid thermal anneal. In some embodiments, a silicidation may be performed to the doped source/drain regions. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide features can be formed by a process that includes depositing a metal layer, annealing the metal layer such that the metal layer is able to react with silicon to form silicide, and then removing the non-reacted metal layer.

In some embodiments, after the formation of the source and drain (S/D) regions, one or more annealing processes may be performed to activate the S/D regions. The annealing processes comprise rapid thermal annealing (RTA), laser annealing processes, or other suitable annealing processes. As an example, a high-temperature thermal annealing step that may apply temperatures anywhere in the range of 900° C.-1100° C., though other embodiments may use temperatures within a different range. As another example, high-temperature annealing includes a "spike" annealing process that has a very short time duration.

In some embodiments, the source and drain region may include epitaxially grown semiconductor material for proper strain effect, leading to enhanced carrier mobility in the channel. In one embodiment, silicon germanium is epitaxially grown in the source and region for a p-type FET (PFET). In another embodiment, silicon carbide is epitaxially. grown in the source and region for a n-type FET (NFET). The method to form the strained structure includes etching to form recesses in the semiconductor substrate and epitaxially growth to form crystalline a semiconductor material in the recesses.

Referring to FIG. 8, after formation of the source and drain region, an ILD (interlayer dielectric) layer 290 is deposited on the semiconductor substrate and between the gate stacks. The deposition of the ILD layer 290 fills in the gaps between adjacent gate stacks. Thereafter, a chemical mechanical polishing (CMP) and/or etch process may be performed on the ILD layer 290 to planarize the ILD layer 290 until the dummy gate 250 is exposed. The ILD layer 290 may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 290 may be deposited by a PECVD process or other suitable deposition technique. In some embodiments, the ILD layer 290 may include an oxide formed by a high aspect ratio process (HARP) and/or high density plasma (HDP) deposition process.

The method 100 proceeds to steps 150 and 160 by performing a replacement gate method to form a HK/metal gate stack. Still referring to FIG. 8, after the dummy gate 250 is exposed, the dummy gate 250 in the gate stack is removed by a dry etch, wet etch, a combination of dry and wet etch, or other suitable process, thereby forming a gate trench 300 in the gate structure. For example, a wet etch process may be used to remove the dummy gate 250. The wet etch process may include exposure to a hydroxide containing solution (e.g., ammonium hydroxide), deionized water, and/or other suitable etchant solutions. It is understood that other etching chemicals may be used for selectively removing the dummy gate 250.

Figure 9:
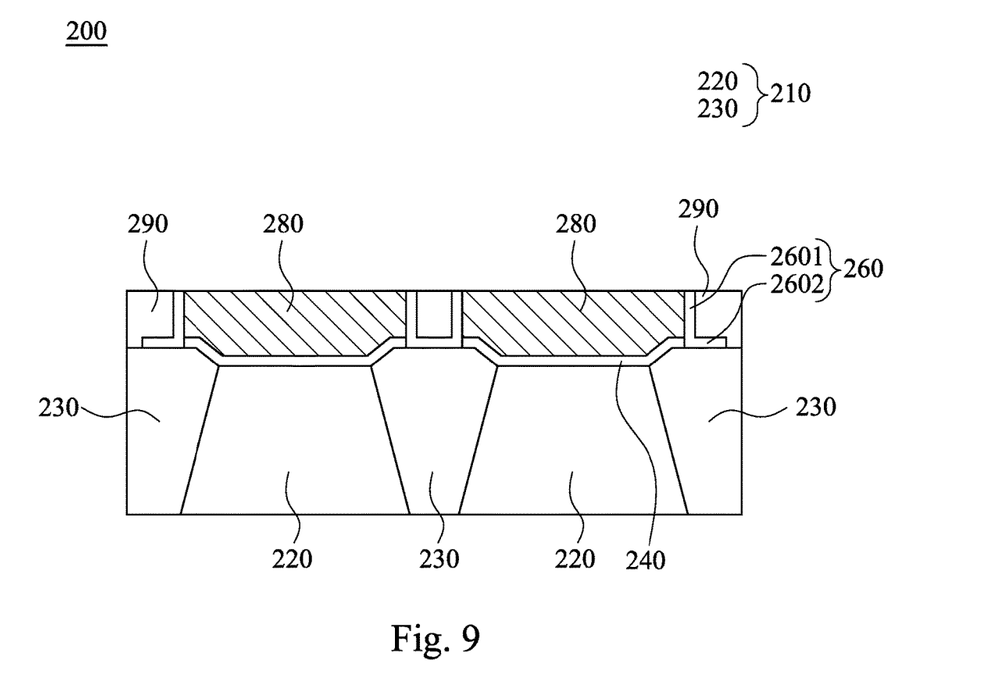

The method 100 then proceeds to step 160 where a gate electrode 280 is formed in the gate trench 300 provided by the step 150 of the method 100 as shown in FIG. 9. In some embodiments, the exemplary gate electrode 280 includes a metal gate, and may also include gate dielectric layer(s), capping layer(s), fill layer(s), and/or other suitable layers (not shown). A work function metal layer (not shown) included in the metal gate may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, and/or other suitable process. In an embodiment, the gate electrode 280 formed is a p-type metal gate including a p-type work function layer.

A dielectric layer (not shown) of the gate electrode 280 (metal gate stacks) may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. The dielectric layer may be the same as or different composed than the gate dielectric layer 240 formed in the gate structure described above in step 120 of the method 100.

In some embodiments, a fill layer (not shown) of the gate electrode 280 may include Al, W, or Cu and/or other suitable materials. The fill metal may be formed by CVD, PVD, plating, and/or other suitable processes. The fill metal may be deposited over a work function metal layer(s), and thereby filling in the remaining portion of the trenches or openings.

In some embodiments, a planarization process is performed to expose a top surface of a gate structure. The planarization process may include a chemical mechanical planarization (CMP). In some embodiments, a metal CMP may be performed to remove the excessive metals layers. The CMP process provides a substantially planar surface for the gate stacks, and ILD layer 290.

In some embodiments, the method for fabricating the semiconductor device may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes. Thus, the above additionally features such as interlayer dielectric, interconnection, and so on may be formed using conventional process steps to complete the fabrication of the semiconductor device 200.

Figure 10:
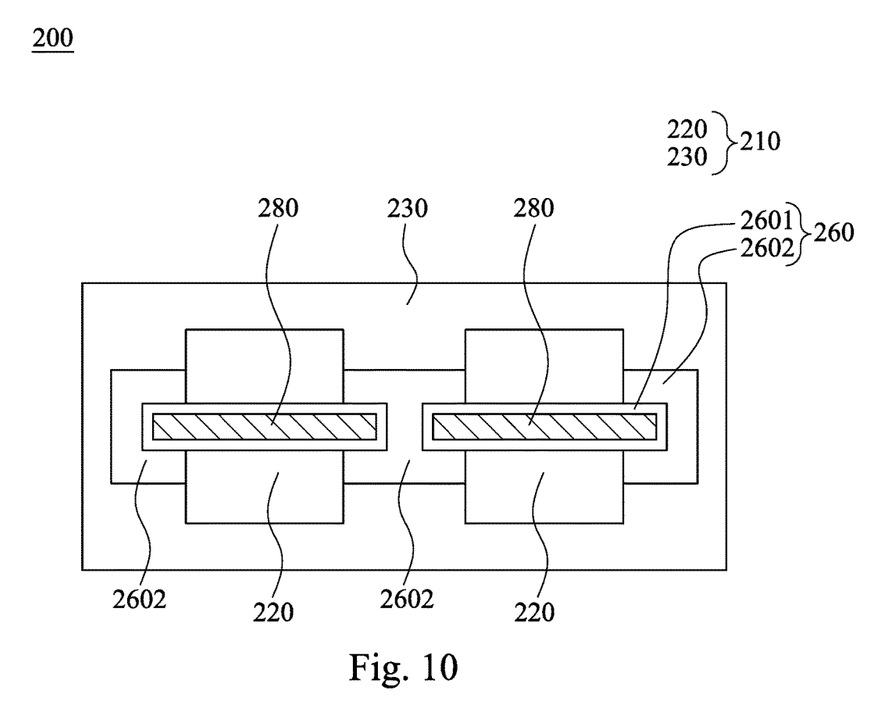
FIG. 10 is a top view of a semiconductor device in accordance with some embodiments of the present disclosure.

Accordingly, exemplary semiconductor device 200 of the present disclosure is obtained. As shown in FIGS. 8 and 9, it may at least include a semiconductor substrate 210 with an active area 220 defined by a plurality of isolation features (e.g. the shallow trench isolation (STI) features) 230; a gate stack extending across the active area 220 onto portions of the isolation features 230, wherein the gate stack comprising a gate dielectric layer (high-k (HK) dielectric material) 240 on the active area 220 and the portions of the isolation features 230, and a gate electrode 280 on the high-k (HK) dielectric material 240; and a protective seal 260 comprising a vertical portion 2601 lining sidewalls of the gate stack (240+280) and a horizontal portion 2602 extending onto a top surface of the isolation features 230, wherein the horizontal portion 2602 surrounding portions of the gate stack outside the active area 220 in a top view, and wherein the protective seal 260 exposes a top surface of the gate stack (240+280). In some embodiments, the exemplary horizontal portion 2602 of the protective seal 260 may has a "⊥" shape or a "⊑" shape in a top view, as shown in FIG. 10. Note that FIG. 10 omits the ILD layer 290 in order to give a clear illustration of the protective seal 260.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metals.

Based on the above, it can be seen that the present disclosure is a semiconductor device and method of fabricating the same to provide a simple and cost-effective process flow to achieve an protective seal to avoid wet etchant to consume shallow trench isolation (STI) features and then penetrate into high-k (HK) dielectric material, thereby preventing a high-k (HK) dielectric material from damage upon etching, for improved yield.

An embodiment is a semiconductor device, comprising: A semiconductor device, comprising: a semiconductor substrate with an active area defined by a plurality of isolation features; a gate stack extending across the active area onto portions of the isolation features, wherein the gate stack comprising a gate dielectric layer on the active area and the portions of the isolation features, and a gate electrode on the gate dielectric layer; and a protective seal comprising a vertical portion lining sidewalls of the gate stack and a horizontal portion extending onto a top surface of the isolation features, wherein the horizontal portion surrounding portions of the gate stack outside the active area in a top view.

Another embodiment is a method for fabricating a semiconductor device, comprising: providing an active region and a plurality of isolation features in a semiconductor substrate; forming a gate dielectric layer on the active area and portions of the isolation features; forming a dummy gate on the gate dielectric layer; forming a protective seal comprising a vertical portion lining sidewalls of the gate stack and a horizontal portion extending onto a top surface of the isolation features, wherein the horizontal portion surrounding portions of the gate stack outside the active area in a top view; removing the dummy gate by etching to form a gate trench, wherein the protective seal protects the gate dielectric layer from damage during the etching; and filling the gate trench with a gate electrode.

A further embodiment is a semiconductor device, comprising: a semiconductor substrate with an active area defined by a plurality of shallow trench isolation (STI) features; a gate stack extending across the active area onto portions of the shallow trench isolation (STI) features, wherein the gate stack comprising a high-k (HK) dielectric material on the active area and the portions of the shallow trench isolation (STI) features, and a gate electrode on the high-k (HK) dielectric material; and a protective seal comprising a vertical portion lining sidewalls of the gate stack and a horizontal portion extending onto a top surface of the shallow trench isolation (STI) features, wherein the horizontal portion surrounding portions of the gate stack outside the active area in a top view, and wherein the protective seal exposes a top surface of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   providing an active area and a plurality of isolation features in a semiconductor substrate;
   forming a gate dielectric layer on the active area and portions of the isolation features;
   forming a dummy gate on the gate dielectric layer;
   forming a protective seal comprising a vertical portion lining sidewalls of the dummy gate and a horizontal portion extending onto top surfaces of the isolation features, wherein the horizontal portion surrounding portions of the dummy gate outside the active area in a top view;
   removing the dummy gate by etching to form a gate trench; and
   filling the gate trench with a gate electrode.

2. The method of claim 1, wherein the forming the protective seal comprises:
   depositing a seal material conformally covering the dummy gate and the top surfaces of the isolation features;
   forming an etch mask covering the seal material on the top surfaces of the isolation features which surround portions of the dummy gate outside the active area in a top view, while exposing the seal material on a top surface of the dummy gate;
   performing an etching process to the seal material exposed by the etch mask, to obtain the protective seal; and
   removing the etch mask.

3. The method of claim 1, wherein the dummy gate is selected from the group consisting of polycrystalline silicon, amorphous silicon, microcrystal silicon, and combinations thereof.

4. The method of claim 1, wherein the etching is a wet etching employing a solution comprising dilute HF (DHF) solution, buffered oxide etch (BOE) solution, hot phosphoric acid, or $H_2O_2$.

5. The method of claim 1, wherein the isolation features are shallow trench isolation (STI) features.

6. The method of claim 1, wherein the gate dielectric layer comprises a high-k (HK) dielectric material.

7. The method of claim 1, wherein the gate dielectric layer is selected from the group consisting of: hafnium oxide, HfSiO, HfSiON, HfTaO, HfTiO, HfZrO, zirconium oxide, aluminum oxide, hafnium dioxide-alumina ($HfO_2$—$Al_2O_3$) alloy, and combinations thereof.

8. The method of claim 1, wherein the gate electrode comprises a metal gate.

9. The method of claim 1, wherein the protective seal comprises silicon nitride, silicon oxynitride, or combinations thereof.

10. The method of claim 1, wherein the protective seal has a thickness of 1 to 40 nm.

11. The method of claim 1, wherein an edge portion of the gate dielectric layer is higher than a center portion of the gate dielectric layer.

12. A method for fabricating a semiconductor device, comprising:
    providing a semiconductor substrate having an active area and an isolation feature;
    forming a gate dielectric layer on the active area such that an edge portion of the gate dielectric layer is higher than a center portion of the gate dielectric layer;
    forming a dummy gate on the gate dielectric layer;
    forming a protective seal comprising a first portion on a sidewall of the dummy gate and a second portion on a top surface of the isolation feature;
    removing the dummy gate to form a gate trench; and
    filling the gate trench with a gate electrode.

13. The method of claim 12, further comprising:
    depositing a seal material conformally on a top surface of the dummy gate and the top surface of the isolation feature;
    forming an etch mask to cover the seal material on the top surface of the isolation feature and to expose the seal material on the top surface of the dummy gate;
    performing an etching process on the seal material on the top surface of the dummy gate to obtain the protective seal; and
    removing the etch mask.

14. The method of claim 12, wherein the dummy gate is selected from the group consisting of: polycrystalline silicon, amorphous silicon, microcrystal silicon, and combinations thereof.

15. The method of claim 13, wherein the etching is a wet etching employing a solution comprising dilute HF (DHF) solution, buffered oxide etch (BOE) solution, hot phosphoric acid, or $H_2O_2$.

16. The method of claim 12, wherein the isolation feature is a shallow trench isolation (STI) feature.

17. The method of claim 12, wherein the gate dielectric layer comprises a high-k dielectric material.

18. The method of claim 1, wherein the gate dielectric layer is selected from the group consisting of: hafnium oxide, HfSiO, HfSiON, HfTaO, HfTiO, HfZrO, zirconium oxide, aluminum oxide, hafnium dioxide-alumina (HfO$_2$—Al$_2$O$_3$) alloy, and combinations thereof.

19. A method for fabricating a semiconductor device, comprising:
   providing a semiconductor substrate that has an active area and an isolation feature;
   forming a gate dielectric layer on the active area;
   forming a dummy gate on the gate dielectric layer;
   forming a protective seal surrounding the dummy gate, in contact with the gate dielectric layer, and comprising a first portion on a sidewall of the dummy gate and a second portion extending on a top surface of the isolation feature;
   removing the dummy gate to form a gate trench; and
   filling the gate trench with a gate electrode.

20. The method of claim 19, wherein forming the gate dielectric layer is such that an edge portion of the gate dielectric layer is higher than a center portion of the gate dielectric layer.

* * * * *